(12) United States Patent
Zhang

(10) Patent No.: US 11,758,792 B2
(45) Date of Patent: Sep. 12, 2023

(54) DISPLAY PANEL INCLUDING STACKED PENETRATING THROUGH-HOLES

(71) Applicant: WUHAN CHINA STAR OPTOELECTRONICS SEMICONDUCTOR DISPLAY TECHNOLOGY CO., LTD., Hubei (CN)

(72) Inventor: Fuyang Zhang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 323 days.

(21) Appl. No.: 16/754,304

(22) PCT Filed: Nov. 15, 2019

(86) PCT No.: PCT/CN2019/118853
§ 371 (c)(1),
(2) Date: Apr. 7, 2020

(87) PCT Pub. No.: WO2021/027166
PCT Pub. Date: Feb. 18, 2021

(65) Prior Publication Data
US 2021/0408173 A1  Dec. 30, 2021

(30) Foreign Application Priority Data
Aug. 9, 2019 (CN) .......................... 201910733246.2

(51) Int. Cl.
*H01L 27/32* (2006.01)
*H01L 29/78* (2006.01)
(Continued)

(52) U.S. Cl.
CPC ...... *H01L 27/3234* (2013.01); *H01L 27/3244* (2013.01); *H01L 51/0097* (2013.01);
(Continued)

(58) Field of Classification Search
CPC . H01L 27/3234; H01L 27/3244; H01L 27/32; H01L 51/0097; H01L 2251/301;
(Continued)

(56) References Cited

U.S. PATENT DOCUMENTS 7,683,838 B2 * 3/2010 Koyama .............. H01Q 1/2283
343/700 MS
9,082,735 B1 * 7/2015 Sundararajan ...... H01L 27/3258
(Continued)

FOREIGN PATENT DOCUMENTS

CN 107451576 A * 12/2017 .......... G06K 9/0004
CN 208384465 U 1/2019
(Continued)

*Primary Examiner* — Ida M Soward
(74) *Attorney, Agent, or Firm* — PV IP PC; Wei Te Chung; Ude Lue

(57) ABSTRACT

A display panel is divided into a display area and a camera area. The camera area includes a first through-hole, a first light-transmitting layer, an inorganic layer, a second through-hole, a second light-transmitting layer, and an image acquisition device. The manufacturing method of the display panel includes a rigid substrate providing step, a flexible substrate forming step, a first etching step, a first light-transmitting layer forming step, a first thin-film transistor (TFT) forming step, a second etching step, a second light-transmitting layer forming step, a second TFT forming step, a rigid substrate stripping step, and an image acquisition device disposing step.

6 Claims, 4 Drawing Sheets

(51) Int. Cl.
*H01L 51/00* (2006.01)
*H01L 51/52* (2006.01)
*G02F 1/13* (2006.01)
*G06F 1/16* (2006.01)
*G09F 9/30* (2006.01)
*H01L 51/56* (2006.01)
*G02F 1/1333* (2006.01)
*H01L 29/786* (2006.01)
*F21K 9/66* (2016.01)

(52) U.S. Cl.
CPC ............... *H01L 51/56* (2013.01); *F21K 9/66* (2016.08); *G02F 1/133305* (2013.01); *G06F 1/1641* (2013.01); *G06F 1/1652* (2013.01); *G09F 9/301* (2013.01); *H01L 27/3246* (2013.01); *H01L 29/7869* (2013.01); *H01L 29/78693* (2013.01); *H01L 51/5275* (2013.01); *H01L 2227/323* (2013.01); *H01L 2251/301* (2013.01); *H01L 2251/5338* (2013.01); *H01L 2251/5392* (2013.01); *H01L 2251/558* (2013.01)

(58) Field of Classification Search
CPC ......... H01L 2251/5338; H01L 27/3246; H01L 29/7869; H01L 29/78693; H01L 51/5276; H01L 2251/558; H01L 2251/5392; G02F 1/133305; G02F 2001/133357; G06F 1/1652; G06F 1/1641; G09F 9/301; F21K 9/66

See application file for complete search history.

(56) References Cited

U.S. PATENT DOCUMENTS

| | | | |
|---|---|---|---|
| 10,050,095 B2* | 8/2018 | Kim | H01L 51/56 |
| 2012/0319291 A1* | 12/2012 | Chiou | H01L 21/76898 257/774 |
| 2013/0093098 A1* | 4/2013 | Yang | H01L 21/76898 438/653 |
| 2016/0181333 A1* | 6/2016 | Park | H01L 27/3246 438/23 |
| 2016/0254337 A1* | 9/2016 | Choi | H01L 27/3265 257/40 |
| 2016/0351645 A1* | 12/2016 | You | H01L 27/326 |
| 2017/0092894 A1* | 3/2017 | Yang | H01L 27/326 |
| 2017/0294502 A1* | 10/2017 | Ka | H01L 27/3258 |
| 2018/0069069 A1* | 3/2018 | Ebisuno | H01L 27/3265 |
| 2018/0159075 A1* | 6/2018 | Kim | H01L 51/56 |
| 2019/0214596 A1* | 7/2019 | Park | H01L 51/5237 |
| 2019/0221782 A1* | 7/2019 | Sun | H01L 51/5012 |
| 2019/0355799 A1* | 11/2019 | Jeong | H01L 27/3276 |
| 2020/0058728 A1* | 2/2020 | Song | H01L 27/3265 |
| 2020/0328261 A1 | 10/2020 | Fang et al. | |
| 2021/0043716 A1* | 2/2021 | Jeon | H01L 27/3276 |
| 2021/0098722 A1 | 4/2021 | Ma | |
| 2021/0408087 A1* | 12/2021 | Wang | H01L 27/1222 |

FOREIGN PATENT DOCUMENTS

| | | | |
|---|---|---|---|
| CN | 208488755 U | * | 2/2019 |
| CN | 109494241 A | | 3/2019 |
| CN | 110034152 A | | 7/2019 |
| CN | 110071150 A | | 7/2019 |

* cited by examiner

DISPLAY PANEL INCLUDING STACKED PENETRATING THROUGH-HOLES

FIELD

The present disclosure relates to the field of display, and more particularly, relates to a display panel, a manufacturing method thereof, and a display device.

BACKGROUND

With rapid development of display technologies, diverse panel technologies bring endless possibilities to electronic terminals. Because of wide applications of the display technologies, particularly represented by organic light-emitting diodes (OLEDs), mobile terminals which have selling points of "full-screen panel", "irregularly shaped panel", "sound device under panel", and "fingerprint recognition device under panel" have been rapidly promoted. Nowadays, although mobile phone and panel manufacturers have launched products with the selling point of "full-screen panel", most products still adopt a notch design or a water-drop notch design, which are similar to the full-screen panel. This is because a certain area must be retained for a front camera lens.

True full-screen panels have been highly anticipated. However, from a technical perspective, a contradiction between realizing integrity of a display panel and retaining the front camera lens of the display panel is a main difficulty. One solution is to dispose the front camera lens under the display panel. However, for flexible display panels, because visible-light transmittance of widely-used flexible substrates is usually low, it is difficult for external visible light to enter a camera lens unit to generate an image when the camera lens is disposed under the display panel.

SUMMARY

An objective of the present disclosure is to solve a technical problem of low light transmittance of camera area in conventional display panels with an under-screen camera.

To achieve the above goal, the present disclosure provides a display panel, including a display area and a camera area. The camera area includes a flexible substrate, a first through-hole penetrating through the flexible substrate, a first light-transmitting layer disposed in the first through-hole, an inorganic layer disposed on a side surface of the flexible substrate, a second through-hole penetrating through the inorganic layer and disposed opposite to the first through-hole, a second light-transmitting layer disposed in the second through-hole, and an image acquisition device disposed opposite to the first light-transmitting layer and disposed on a surface of the first light-transmitting layer away from the second light-transmitting layer.

Furthermore, the first light-transmitting layer includes a transparent resin material, and/or the second light-transmitting layer includes a transparent resin material.

Furthermore, the transparent resin material includes a transparent polyimide material.

Furthermore, visible-light transmittance of the transparent polyimide material ranges from 95% to 100%.

Furthermore, the image acquisition device includes a camera lens, wherein a central axis of the camera lens and a central axis of the first light-transmitting layer are on a same straight line.

A method of manufacturing a display panel, including following steps: a rigid substrate providing step, including providing a rigid substrate; a flexible substrate forming step, including forming a flexible substrate on a top surface of the rigid substrate; a first etching step, including etching a portion of the flexible substrate to form a first through-hole; a first light-transmitting layer forming step, including forming a first light-transmitting layer in the first through-hole; a first thin-film transistor (TFT) forming step, including forming a portion of a TFT on a top surface of the flexible substrate, wherein the portion of the TFT includes an inorganic layer; a second etching step, including partially etching the inorganic layer to form a second through-hole, wherein the second through-hole is disposed opposite to the first through-hole; a second light-transmitting layer forming step, including forming a second light-transmitting layer in the second through-hole; a second TFT forming step, including forming an entire TFT on the top surface of the inorganic layer; a rigid substrate stripping step, including stripping the rigid substrate; and an image acquisition device disposing step, including disposing an image acquisition device on a bottom surface of the first light-transmitting layer.

Furthermore, the first light-transmitting layer forming step includes: filling the first through-hole with a transparent resin material, and curing the transparent resin material to form the first light-transmitting layer.

Furthermore, the second light-transmitting layer forming step includes: filling the second through-hole with a transparent resin material, and curing the transparent resin material to form the second light-transmitting layer.

Furthermore, an anode layer forming step is performed after the second TFT forming step and includes: forming an anode layer on a top surface of the TFT.

To achieve the above goal, the present disclosure further provides a display device, including the above-mentioned display panel.

Regarding the beneficial effects: transparency and light transmittance of layers in a camera area are increased so that light intensity in the camera area increases, thereby further improving camera performance of electronic devices with under-screen cameras and satisfying a high demand of users for the under-screen cameras.

Figure 1:
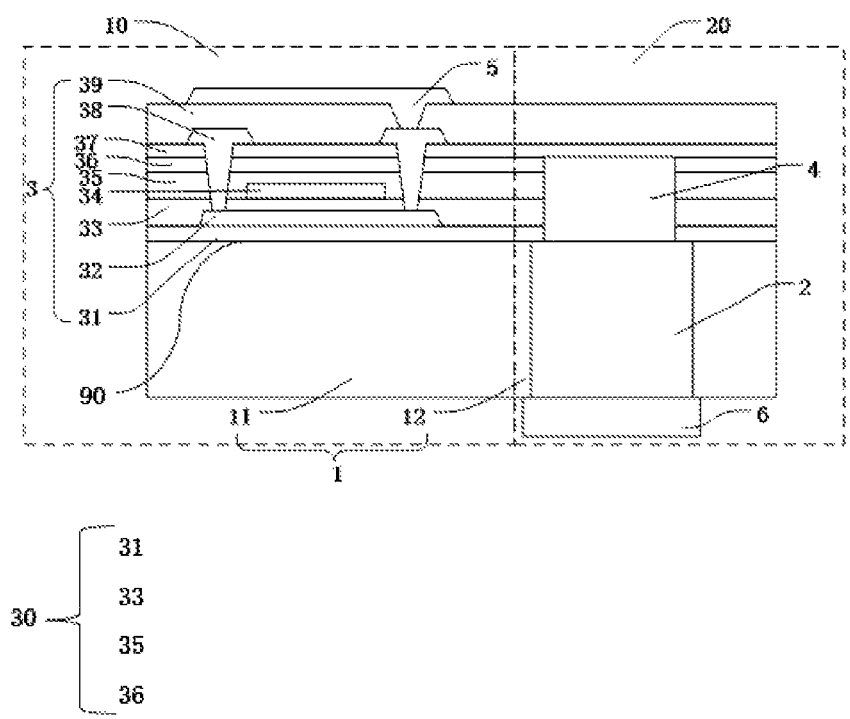
FIG. 1 is a schematic structural view showing a display panel according to an embodiment of the present disclosure.

Reference characters in the drawings are illustrated as follows: rigid substrate 100; flexible substrate 1; top surface 90 of the flexible substrate 1; first light-transmitting layer 2; thin-film transistor 3; second light-transmitting layer 4; anode layer 5; image acquisition device 6; display area 10; first flexible substrate 11; second flexible substrate 12; first through-hole 13; camera area 20; inorganic layer 30; buffer layer 31; active layer 32, first gate insulating layer 33; gate layer 34; second gate insulating layer 35; dielectric layer 36; barrier layer 37; source/drain layer 38; and planarization layer 39; and second through-hole 41.

DETAILED DESCRIPTION

Preferred embodiments of the present disclosure are illustrated below with reference to accompanying drawings to prove that the present disclosure can be implemented. The embodiments are used to fully describe technical solutions of the present disclosure so that those skilled in the art may clearly and easily understand the technical solutions. The present disclosure may be realized by many different types of embodiments; therefore, the scope of protection of the present disclosure is not limited to the embodiments mentioned in the specification.

It should be understood that terms such as "upper", "lower", "front", "rear", "left", "right", "inside", "outside," "lateral", as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure.

The identical or similar reference numerals constantly denote the identical or similar elements or elements having the identical or similar functions. In addition, for the sake of better understanding and description, the size and thickness of each component shown in the drawings are arbitrarily shown, but the present disclosure is not limited thereto.

It should be noted that a structure in which a first feature is "on" a second feature may include an embodiment in which the first feature directly contacts the second feature and may also include an embodiment in which an additional feature is formed between the first feature and the second feature. It should be noted that a structure in which a first feature is "mounted on" or "connected to" a second feature may include an embodiment in which the first feature directly mounted on or connected to the second feature and may also include an embodiment in which the first feature is mounted on or connected to the second feature by an additional feature.

The present embodiment provides a display device, including a display panel as shown in FIG. 1. The display panel includes a flexible substrate 1, a first light-transmitting layer 2, a thin-film transistor (TFT) 3, a second light-transmitting layer 4, an anode layer 5, and an image acquisition device 6.

The display panel is divided into a display area 10 and a camera area 20. The display area 10 is configured to display images, and the camera area 20 is configured to receive external visible light to realize a camera function.

The display area 10 includes a first flexible substrate 11, the TFT 3, and the anode layer 5. The camera 20 includes a second flexible substrate 12, the first light-transmitting layer 2, a second light-transmitting layer 4, and the image acquisition device 6.

The flexible substrate 1 includes a polyimide (PI) material, and an average visible-light transmittance of the PI material ranges from 65% to 80%

Figure 3:
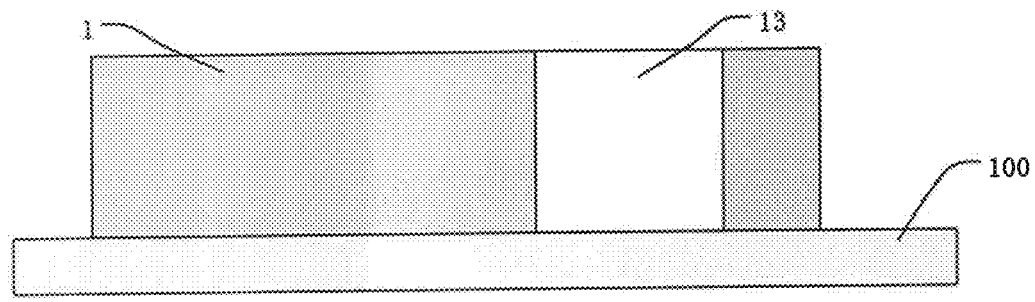
FIG. 3 is a schematic structural view showing the display panel after a first etching step according to the embodiment of the present disclosure.

A first through-hole 13 as shown in FIG. 3 is defined in the camera area of the flexible substrate 1. The first through-hole 13 penetrates through the flexible substrate 1 and provides a tunnel for a subsequent first light-transmitting layer.

The first light-transmitting layer 2 is disposed in the first through-hole 13 and fills the first through-hole 13, and the first light-transmitting layer 2 includes a transparent resin material. In the present embodiment, a preferred material of the first light-transmitting layer 2 is a colorless and transparent polyimide (PI) material, and visible-light transmittance of the colorless and transparent PI material ranges from 95% to 100%. Therefore, visible-light transmittance of the first light-transmitting layer 2 is higher than visible-light transmittance of the flexible substrate 1. Visible-light transmittance of the camera area 20 may increase, and visible-light transmittance of the display device may further increase.

The TFT 3 is disposed on a top surface of the flexible substrate 1 and is disposed in the display area 10. The TFT 3 includes a buffer layer 31, an active layer 32, a first gate insulating layer 33, a gate layer 34, a second gate insulating layer 35, a dielectric layer 36, a barrier layer 37, a source/drain layer 38, and a planarization layer 39.

The buffer layer 31 is disposed on the top surface of the flexible substrate 1 and has buffering function, and the buffer layer 31 includes $SiO_2$ or $SiN_x$. The buffer layer 31 may be a single layer of $SiO_2$ or a multilayer of $SiO_2$ and $SiN_x$, and the $SiO_2$ layer is an uppermost layer.

The active layer 32 is disposed on a top surface of the buffer layer 31 and includes a semiconductor section and a conductor section. The conductor section is disposed on an outer side of the semiconductor section, and the semiconductor section retains properties of semiconductors. The active layer 32 includes an oxide semiconductor, such as IGZO, with a thickness ranging from 300 Å to 500 Å.

The first gate insulating layer 33 is disposed on top surfaces of the active layer 32 and the buffer layer 31. The first gate insulating layer 33 may be a single layer of $SiO_2$ or a multilayer of $SiO_2$ and $SiN_x$, and the layer of $SiO_2$ is a lowermost layer. The first gate insulating layer 33 has an insulating property, which prevents short circuit from happening in the TFT 3.

The gate insulating layer 34 is disposed on a top surface of the first gate insulating layer 33 and is disposed opposite to the active layer 31. The gate layer 34 includes a metal such as Cu or Mo.

The second gate insulating layer 35 is disposed on top surfaces of the first gate insulating layer 33 and the gate layer 34. The second gate insulating layer 33 may be a single layer of $SiO_2$ or a multilayer of $SiO_2$ and $SiN_x$, and the layer of $SiO_2$ is the lowermost layer. The second gate insulating layer 35 has an insulating property, which prevents short circuit from happening in the TFT 3.

The dielectric layer 36 is disposed on a top surface of the second gate insulating layer 35. Two or more of dielectric through-holes are defined on the dielectric layer 36 and are positioned opposite to the conductor section of the active layer 32. The dielectric through-holes are configured to provide tunnels for a subsequent source/drain layer.

The barrier layer 37 is disposed on a top surface of the dielectric layer 36. The barrier layer 37 blocks the insulating layer to prevent short circuit from happening in the TFT 3.

The source/drain layer 38 is disposed in the dielectric through-holes and extends to a top surface of the barrier layer 37. The source/drain layer 38 is connected to the conductor section of the active layer 32 to realize an electrical connection between the source/drain layer 38 and the active layer 32. The source/drain layer 38 includes a metal.

The planarization layer 39 is disposed on top surfaces of the source/drain layer 38 and barrier layer 37. The planarization layer 39 is configured to maintain surface flatness of the TFT 3 so that subsequent layers can be manufactured easily, thereby preventing layers from stripping due to uneven surface flatness.

The buffer layer 31, the first gate insulating layer 33, the second gate insulating layer 35, and the dielectric layer 36 of the TFT 3 form an inorganic layer disposed on the top surface of the flexible substrate 1, and visible-light transmittance of the inorganic layer ranges from 85% to 95%.

Figure 5:
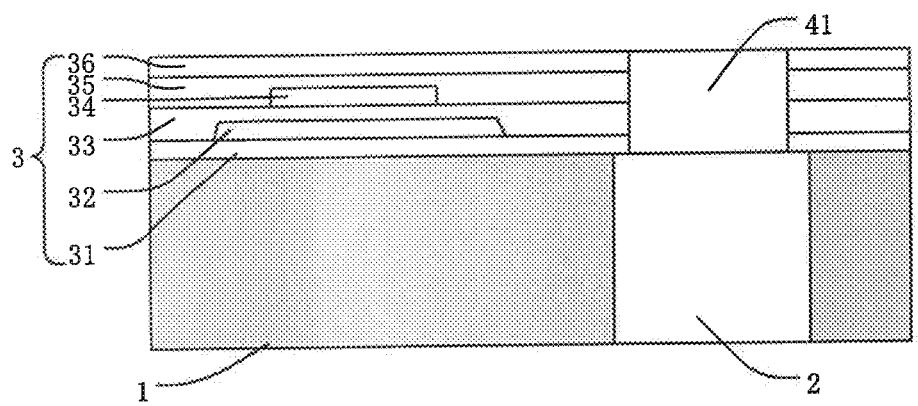
FIG. 5 is a schematic structural view showing the display panel after a second etching step according to the embodiment of the present disclosure.

A second through-hole 41, as shown in FIG. 5, is defined on the inorganic layer. The second through-hole 41 penetrates through the inorganic layer and provides a tunnel for a subsequent second light-transmitting layer.

The second light-transmitting layer 4 is disposed in the second through-hole 41 and fills the second through-hole 41, and the second light-transmitting layer 4 includes a transparent resin material. In the present embodiment, a preferred material of the second light-transmitting layer 4 is a colorless and transparent polyimide (PI) material, and visible-light transmittance of the colorless and transparent PI material ranges from 95% to 100%. Therefore, visible-light transmittance of the second light-transmitting layer 4 is higher than visible-light transmittance of the inorganic layer, visible-light transmittance of the camera area 20 may increase, and visible-light transmittance of the display device may further increase.

The anode layer 5 is disposed on a top surface of the planarization layer 39. The anode layer 5 penetrates through the planarization layer 39 and is electrically connected to the source/drain layer 38 to provide electric power to a subsequent pixel luminescent layer.

The display panel further includes layers, such as a pixel defining layer, a luminescent layer, and a cathode layer, which are disposed on the anode layer 5. Such layers are conventional technologies and are not described here.

The image acquisition device 6 includes a camera lens, and a central axis of the camera lens and a central axis of the first light-transmitting layer 2 are on a same straight line. Visible light enters the display panel from a top of the camera area 20, passes through each layer, and generates an image at the camera lens, thereby realizing an under-screen camera function.

Regarding the beneficial effects: transparency and light transmittance of layers in a camera area are increased so that light intensity in the camera area increases, thereby improving camera performance of electronic devices with under-screen cameras and satisfying a high demand of users for the under-screen cameras.

Figure 2:
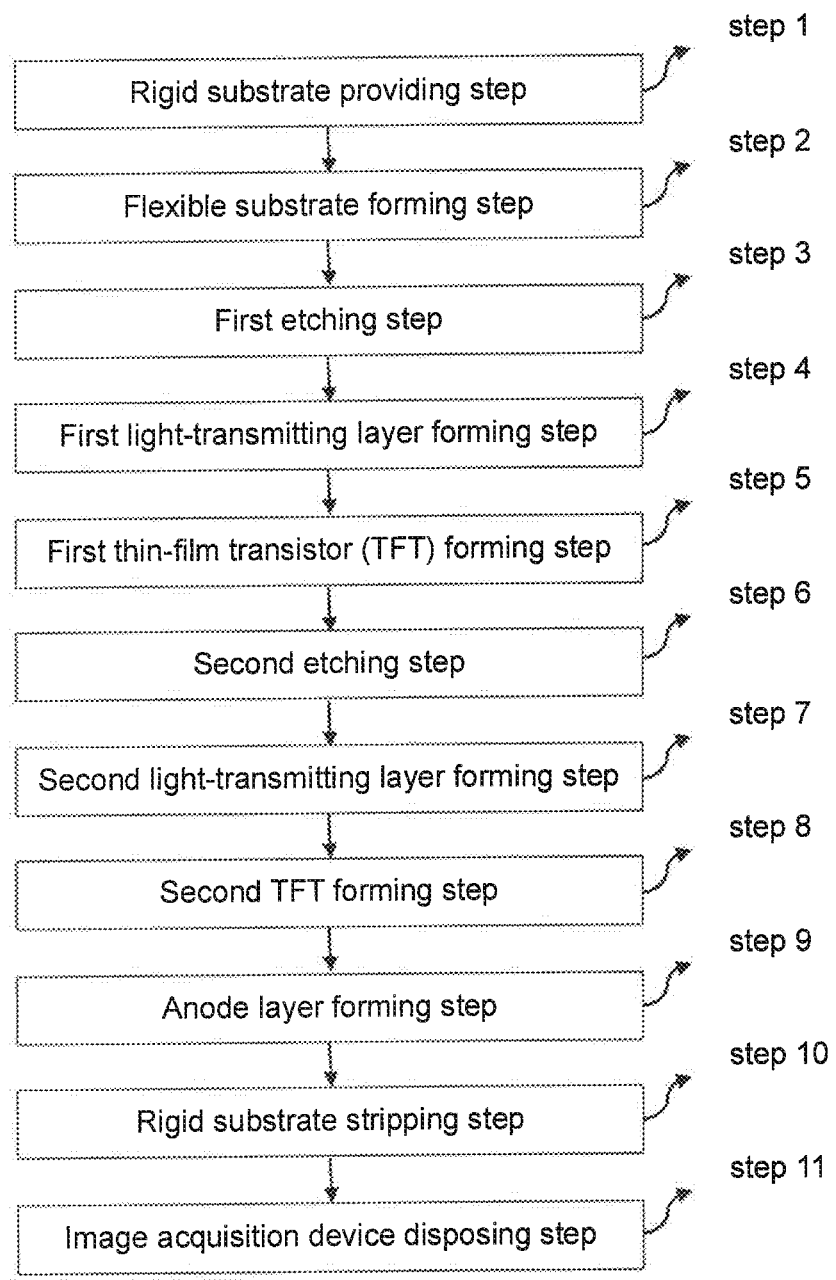
FIG. 2 is a flowchart showing a method of manufacturing a display panel according to an embodiment of the present disclosure.

As shown in FIG. 2, the present embodiment further provides a method of manufacturing a display panel, including steps 1 to 11.

The step 1: a rigid substrate providing step, including providing a rigid substrate, wherein the rigid substrate may be glass.

The step 2: a flexible substrate forming step, including forming a flexible substrate on a top surface of the rigid substrate, wherein the flexible substrate is a polyimide (PI) material, and an average visible-light transmittance of the PI material ranges from 65% to 80%.

The step 3: a first etching step, including etching a portion of the flexible substrate to form a first through-hole 13 as shown in FIG. 3. The first through-hole 13 penetrates through the flexible substrate 1 and is configured to provide a tunnel for a subsequent first light-transmitting layer.

The step 4: a first light-transmitting layer forming step, including filling the first through-hole with a transparent resin material. In the present embodiment, a preferred transparent resin material is a colorless and transparent PI material which is cured to form the first light-transmitting layer. Visible-light transmittance of the colorless and transparent PI material ranges from 95% to 100%. so that visible-light transmittance of the first light-transmitting layer is higher than visible-light transmittance of the flexible substrate.

Figure 4:
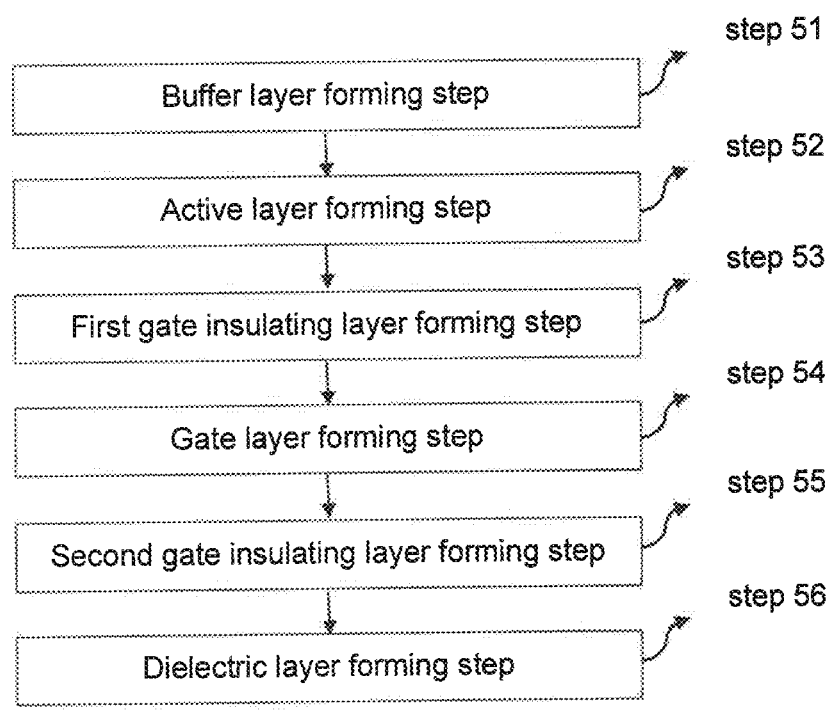
FIG. 4 is a flowchart showing a first thin-film transistor (TFT) forming step according to the embodiment of the present disclosure.

The step 5: a first thin-film transistor (TFT) forming step, including forming a portion of a TFT on a top surface of the flexible substrate. As shown in FIG. 4, the first TFT forming step includes steps 51 to 56, and a structure of a display panel formed by the above steps is as shown in FIG. 5.

The step 51: a buffer layer forming step, including forming a buffer layer 31 on the top surface of the flexible substrate 1. The buffer layer 31 has buffering function. The buffer layer 31 may be SiO2 or SiNx. The buffer layer 31 may be a single layer of SiO2 or a multilayer of SiO2 and SiNx, and the layer of SiO2 is an uppermost layer.

The step 52: an active layer forming step, including depositing an oxide semiconductor material, such as IGZO, on a top surface of the buffer layer 31, and performing a conductorization process and a pattern forming process on the oxide semiconductor material to form an active layer 32 with a thickness ranging from 300 Å to 500 Å.

The step 53: a first gate insulating layer forming step, including depositing a single layer of SiO2 or a multilayer of SiO2 and SiNx on top surfaces of the active layer 32 and the buffer layer 31 to form a first gate insulating layer 33, wherein the layer of SiO2 is a lowermost layer. The first gate insulating layer 33 has an insulating property, which prevents short circuit from happening in the TFT 3.

The step 54: a gate layer forming step, including depositing a metal material, such as Cu or Mo, on a top surface of the first gate insulating layer 33 to form a gate layer 34, wherein the gate layer 34 is disposed opposite to the active layer 31.

The step 55: a second gate insulating layer forming step, including depositing a single layer of SiO2 or a multilayer of SiO2 and SiNx on top surfaces of the first gate insulating layer 33 and the gate layer 34 to form a second gate insulating layer 35. The second gate insulating layer 35 has an insulating property, which prevents short circuit from happening in the TFT 3.

The step 56: a dielectric layer forming step, including forming a dielectric layer 36 on a top surface of the second gate insulating layer 35. The dielectric layer 36 is made of an inorganic material with an insulating property, thereby preventing short circuit from happening in the TFT 3.

The step 6: a second etching step, including forming an inorganic layer. as shown in FIG. 5, from the buffer layer 31, the first gate insulating layer 33, the second gate insulating layer 35, and the dielectric layer 36, which are formed in the first TFT forming step, wherein visible-light transmittance of the inorganic layer ranges from 85% to 95%. The inorganic layer on the first light-transmitting layer 2 is etched by dry-etching technology to form a second through-hole 41. Because the first through-hole and the second through-hole 41 are not formed in a same process, an aperture of the second through-hole 41 and an aperture of the first through-hole may be different. The second through-hole 41 provides a tunnel for a subsequent second light-transmitting layer.

The step 7: a second light-transmitting layer forming step, including filling the second through-hole with a transparent resin material. In the present embodiment, a preferred transparent resin material is a colorless and transparent PI material, and the colorless and transparent PI material is cured to form the second light-transmitting layer. Visible-light transmittance of the colorless and transparent PI material ranges from 95% to 100%, so that visible-light transmittance of the second light-transmitting layer is higher than visible-light transmittance of the inorganic layer.

Figure 6:
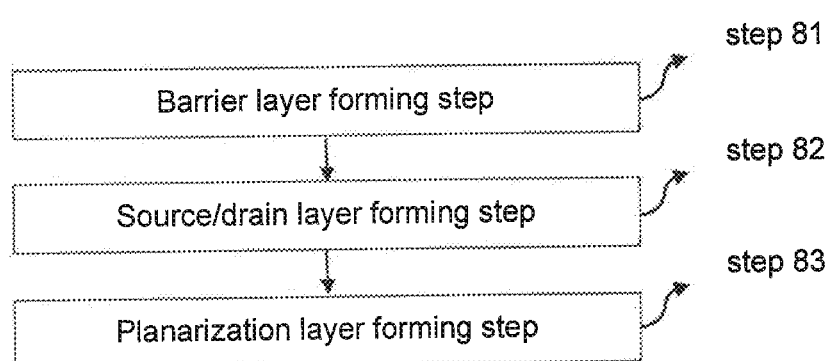
FIG. 6 is a flowchart showing a second TFT forming step according to the embodiment of the present disclosure.

The step 8: a second TFT forming step, including forming other layers of the TFT on the second light-transmitting layer. As shown in FIG. 6. The second TFT forming step includes steps 81 to 83.

The step 81: a barrier layer forming step, including forming a barrier layer on a top surface of the dielectric layer. The barrier layer has an insulating property, which prevents short circuit from happening in the TFT.

The step 82: a source/drain layer forming step, including forming a source/drain layer on a top surface of the barrier layer. The source/drain layer sequentially penetrates through the barrier layer, the dielectric layer, the second gate insulating layer, and the first gate insulating layer. The source/drain layer is electrically connected to the active layer to realize an electrical connection between the source/drain layer and the active layer. The source/drain layer is a metal.

The step 83: a planarization layer forming step, including forming a planarization layer on top surfaces of the source/drain layer and the barrier layer. The planarization layer is configured to ensure surface flatness of the TFT, so that subsequent layers can be formed easily, thereby preventing layers from stripping due to uneven surface flatness.

A display area where the TFT formed by the first TFT forming step and the TFT formed by the second TFT forming step are formed is used to display images.

The step 9: an anode layer forming step, including forming an anode layer on a top surface of the planarization layer. The anode layer penetrates through the planarization layer and is electrically connected to the source/drain layer to realize an electrical connection between the anode layer and the TFT, thereby providing electrical signals to a subsequent pixel luminescent layer.

The step 10: a rigid substrate stripping step, including stripping the rigid substrate by laser stripping technology or mechanical stripping technology.

The step 11: an image acquisition device disposing step, including disposing an image acquisition device on a bottom side of the first light-transmitting layer. The image acquisition device includes a camera lens, and an area where the camera lens is disposed is a camera area. Light passes through the second light-transmitting layer and the first light-transmitting layer, enters the camera lens, and forms an image at the camera lens, thereby realizing an under-screen camera function. Because the visible-light transmittance of the first light-transmitting layer and the visible-light transmittance of the second light-transmitting layer both range from 95% to 100%, visible-light transmittance of the camera area significantly increases. As a result, a camera performance of display devices with under-screen cameras is improved, and a high user demand for the under-screen cameras is satisfied.

Regarding the beneficial effects: materials of layers above a camera lens are changed to colorless and transparent materials. Therefore, transparency and light transmittance of layers in a camera area are increased, and light intensity in the camera area increases as well, thereby improving camera performance of electronic devices with under-screen cameras and satisfying a high user demand for the under-screen cameras.

The above are merely preferred embodiments of the present invention. It is understood that many changes and modifications to the described embodiment can be carried out without departing from the scope and the spirit of the disclosure that is intended to be limited only by the appended claims.

What is claimed is:

1. A display panel, comprising a display area and a camera area;
   wherein the camera area comprises:
   a flexible substrate;
   a first through-hole penetrating through the flexible substrate;
   a first light-transmitting layer disposed in the first through-hole;
   an inorganic layer disposed on a top surface of the flexible substrate;
   a second through-hole penetrating through the inorganic layer and positioned opposite to the first through-hole;
   a second light-transmitting layer disposed in the second through-hole; and
   an image acquisition device disposed opposite to the first light-transmitting layer and disposed on a surface of the first light-transmitting layer away from the second light-transmitting layer.

2. The display panel of claim 1, wherein the first light-transmitting layer comprises a transparent resin material; and/or
   the second light-transmitting layer comprises a transparent resin material.

3. The display panel of claim 2, wherein the transparent resin material comprises a transparent polyimide material.

4. The display panel of claim 3, wherein visible-light transmittance of the transparent polyimide material ranges from 95% to 100%.

5. The display panel of claim 1, wherein the image acquisition device comprises a camera lens, wherein a central axis of the camera lens and a central axis of the first light-transmitting layer are on a same straight line.

6. A display device, comprising the display panel of claim 1.

* * * * *